United States Patent [19]
Kobayashi

[11] Patent Number: 5,939,240
[45] Date of Patent: Aug. 17, 1999

[54] SEMICONDUCTOR ELEMENT STRUCTURE WITH STEPPED PORTION FOR FORMATION OF ELEMENT PATTERNS

[75] Inventor: Migaku Kobayashi, Tokyo, Japan

[73] Assignee: NEC Corporation, Tokyo, Japan

[21] Appl. No.: 09/035,964

[22] Filed: Mar. 6, 1998

Related U.S. Application Data

[62] Division of application No. 08/625,039, Mar. 29, 1996, Pat. No. 5,798,543.

[30] Foreign Application Priority Data

Mar. 31, 1995 [JP] Japan ................................ 7-75715

[51] Int. Cl.[6] ................................................ G03C 5/16
[52] U.S. Cl. ........................................ 430/313; 430/311
[58] Field of Search ................................ 430/311, 313

[56] References Cited

U.S. PATENT DOCUMENTS

| | | | |
|---|---|---|---|
| 4,906,852 | 3/1990 | Nakata et al. | 250/548 |
| 5,133,603 | 7/1992 | Suzuki et al. | 356/400 |
| 5,134,085 | 7/1992 | Gilgen et al. | 437/52 |
| 5,289,422 | 2/1994 | Mametani | 365/210 |
| 5,290,725 | 3/1994 | Tanaka et al. | 437/52 |
| 5,321,285 | 6/1994 | Lee et al. | 257/296 |
| 5,325,414 | 6/1994 | Tanaka et al. | 378/34 |
| 5,378,644 | 1/1995 | Morihara | 437/44 |
| 5,547,788 | 8/1996 | Han et al. | 430/5 |

FOREIGN PATENT DOCUMENTS

64-31415  2/1989  Japan .

*Primary Examiner*—Janet Baxter
*Assistant Examiner*—Jill N. Holloman
*Attorney, Agent, or Firm*—Whitham, Curtis & Whitham

[57] ABSTRACT

The semiconductor device disclosed has semiconductor patterns as elements constituting a semiconductor device on a semiconductor substrate. The semiconductor patterns are formed respectively on a first region and a second region on the semiconductor substrate. Between the first region and the second region, there is a stepped portion which is set such that a value S of the step is $S=m\lambda/2n$ wherein $\lambda$ is a wavelength of the photosensitive illuminating light used in a photolithography process for patterning a photoresist film, m is a positive integer, and n is a refractive index of the photoresist film. The provision of the stepped portion enables the formation of semiconductor element patterns of fine sizes with controllability thereof.

7 Claims, 9 Drawing Sheets

FIG. 6F

SEMICONDUCTOR ELEMENT STRUCTURE WITH STEPPED PORTION FOR FORMATION OF ELEMENT PATTERNS

This application is a division of Ser. No. 08/625,039, filed Mar. 29, 1996 now U.S. Pat. No. 5,798,543

BACKGROUND OF THE INVENTION (1) Field of the Invention

The present invention relates to a semiconductor device, and more particularly to a semiconductor element structure in which a fine pattern can be formed with high controllability.

(2) Description of the Related Art

Active research on making semiconductor elements finer and more dense is in progress and, nowadays, there have been developed test devices such as a memory device designed with a size standard of 0.15–0.25 $\mu$m or an ultra high integrated semiconductor device such as a logic device. With advancement of high integration in a semiconductor devices, the size of the semiconductor elements is becoming increasingly finer. Thus, it is becoming more important to reduce the width of gate electrodes, the width of diffusion layers, the size of contact holes interconnecting wiring layers, the film thickness of materials constituting semiconductor elements, etc.

Any variations in pattern sizes of finely formed elements of semiconductor elements, especially any variations in gate electrode widths, produce the largest influence on the characteristics of an insulated-gate field effect transistor (hereinafter called "MOS transistor"). Also, in the contact hole interconnecting the wiring layers, a reduction in the size thereof or an increase in the aspect ratio thereof makes it difficult to ensure the reliability of the semiconductor element. For this reason, it is essential in the manufacture of the semiconductor device to reduce the variations in the sizes concerned.

Thus, as the semiconductor element becomes finer, it becomes more important to have a higher degree of control of patterns constituting semiconductor elements.

A method for fabricating the above prior art semiconductor element is explained with reference to FIGS. 1A–1F. They are sectional views showing a structure under fabrication for use in explaining sequential steps for forming a gate electrode or a gate electrode interconnect.

Figure 1A:
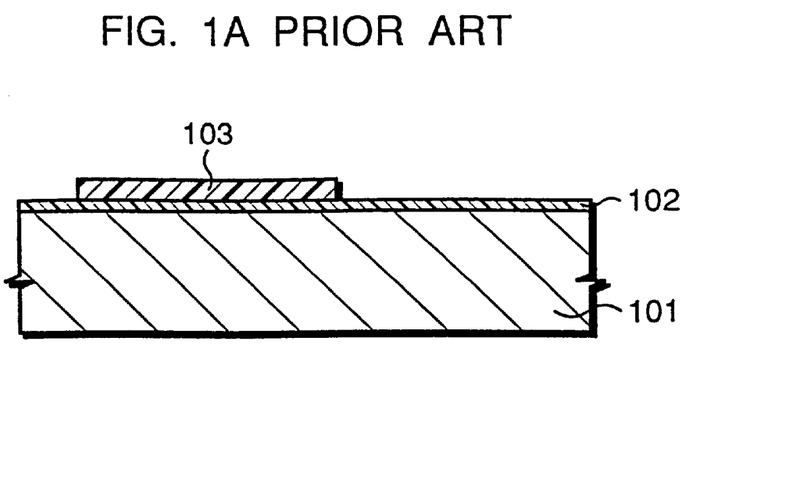
FIGS. 1A–1F are sectional views showing a structure under fabrication for use in explaining sequential steps of a prior art method for fabricating a semiconductor device.
Figure 1B:
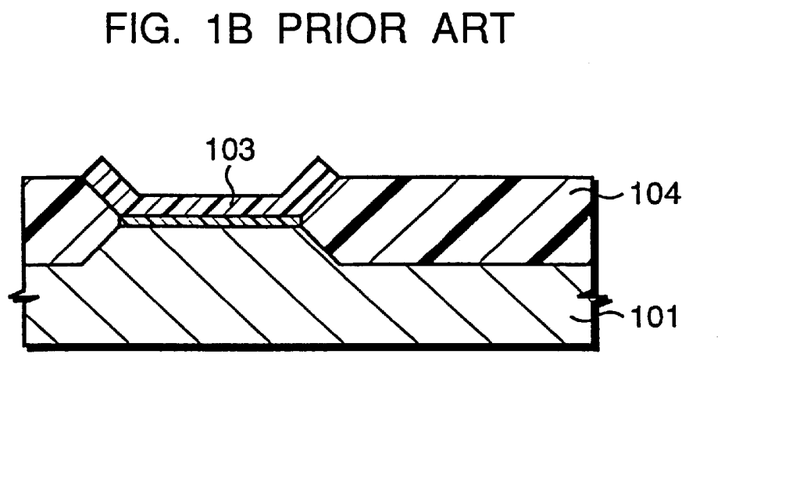

As shown in FIG. 1A, a pad oxide film 102 is formed on a silicon substrate 101 by a thermal oxidation process, and a silicon nitride film is formed on the pad oxide film 102 by an LPCVD (Low Pressure Chemical Vapor Deposition) process. The silicon nitride film at a portion corresponding to an element isolation region is removed by photolithography and dry-etching processes whereby a mask nitride film 103 is formed. Thereafter, as shown in FIG. 1B, by a thermal oxidation process, the silicon substrate 101 at a portion where the element isolation region is formed is selectively oxidized using the mask nitride film 103 as a mask whereby a field oxide film 104 is formed.

Figure 1C:
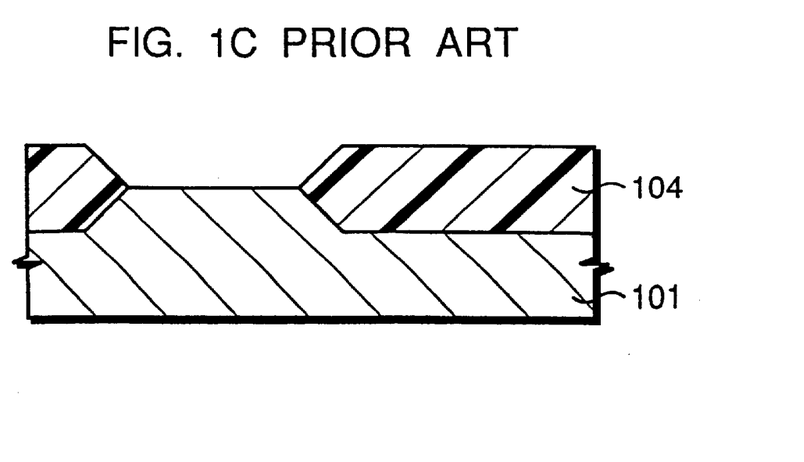

Next, a thin silicon oxide film formed on the mask nitride film 103 is removed by wet-etching with a buffered hydrofluoric acid solution. Then, the mask nitride film 103 is removed by etching using a phosphoric acid solution at a high temperature. Then, the pad oxide film 102 is removed by etching with a buffered hydrofluoric acid solution. In this way, as shown in FIG. 1C, the silicon substrate 101 is selectively exposed.

In the series of wet-etchings explained above, the field oxide film 104 is also etched and its thickness is reduced. Here, the time that is required for each of the steps of etching of the silicon oxide film on the surface of the mask nitride film 103, etching of the mask nitride film 103 and etching of the pad oxide film 102, is taken into account for setting the time for the complete removal of each insulating film. For this reason, the control of the thickness of the field oxide film 104 after the thickness has been reduced as explained above is not sufficient.

Figure 1D:
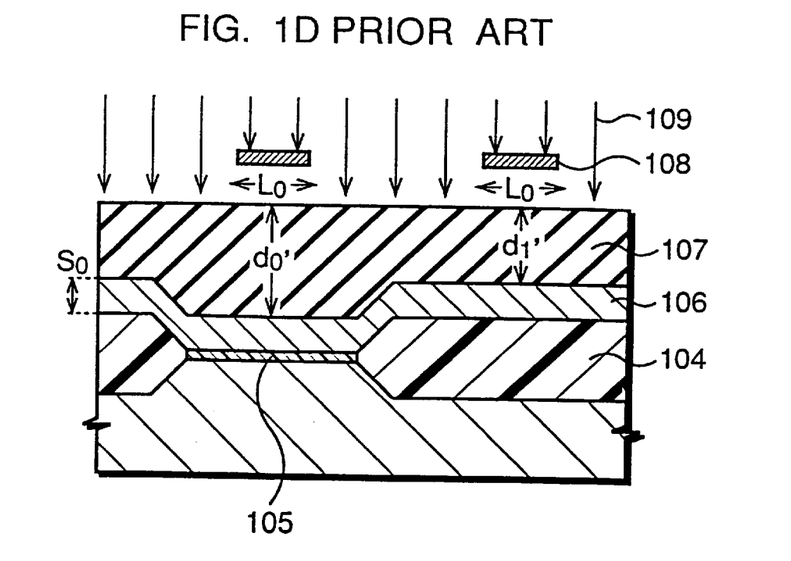

Next, as shown in FIG. 1D, a gate oxide film 105 is formed on the exposed surface of the silicon substrate 101 by a thermal oxidation process. Then, a polycide film 106 is deposited by LPCVD and sputtering processes. This polycide film 106 is one in which a phosphorus impurity has been introduced by a diffusion process or an ion implantation process. Next, a photoresist film 107 is applied on the entire resulting surface. The photoresist used is a known positive type photoresist.

As to the photoresist film applied, as shown in FIG. 1D, if the thickness of the photoresist 107 over the region of the field oxide film 104 is made $d_1'$ and the thickness of the photoresist 107 over the region of the gate oxide film 105 is made $d_0'$, then $d_1'$ is smaller than $d_0'$ by the magnitude of the underlying layer step formed by the difference between the upper surface of the field oxide film 104 and the upper surface of the gate oxide film 105. This value of the difference is shown by $S_0$ in FIG. 1D.

Figure 1E:
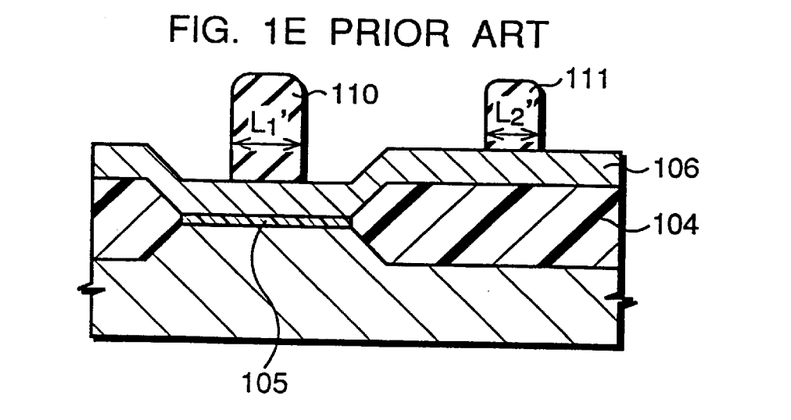

Next, the transfer of the mask projection pattern 108 onto the photoresist film 107 is carried out using a step-and-repeat projection exposure system (hereinafter referred to as a "stepper"). Here, the size of the mask projection pattern 108 is made $L_0$. Also, as the photosensitive illuminating light 109 of the stepper, i-ray having a wavelength of 365 nm is used. In this way, the resist patterns 110 and 111 as shown in FIG. 1E are formed. Here, the size of the resist pattern 110 formed on the region of the gate oxide film 105 is made $L_1'$, and the size of the resist pattern 111 formed on the region of the field oxide film 104 is made $L_2'$.

Figure 1F:
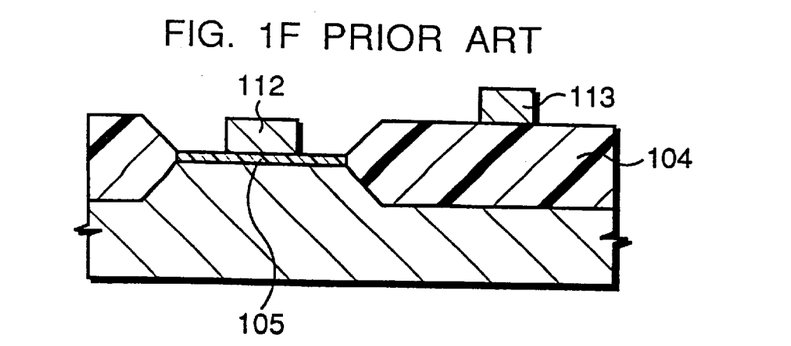

Thereafter, the polycide film 106 described above is etched by dry-etching using the resist patterns 110 and 111 as etching masks. In this way, as shown in FIG. 1F, a gate electrode 112 is formed on an active element region, that is, gate oxide film 105, and a gate electrode interconnect 113 on an element isolation region, that is, a field oxide film 104.

In the prior art techniques explained above, the underlying layer step $S_0$ between the surface of the field oxide film 104 and the surface of the gate oxide film 105 is determined independently of the photolithography process step. Generally, a parasitic MOS transistor is formed at the element isolation region, but the thickness of the field oxide film 104 is set such that the threshold voltage of this parasitic MOS transistor is sufficiently high. The stepped portion which develops between the surfaces of the field oxide film 104 and the gate oxide film 105 remains uncontrolled.

Thus, for the reason that, where the thickness of the photoresist film on the active element region is $d_0'$, the thickness of the photoresist on the element isolation region becomes $d_1'(=d_0'-S_0)$, there arise problems that may be grouped into the two kinds explained below.

The first kind of problem is as follows. Where the transfer is made of the mask projection patterns 108 both having the same size $L_0$ between the active element region and the element isolation region, the exposure condition is set such that the size of the resist pattern 110 on the active element region after the exposure and development becomes $L_0$. In such a case, the thickness of the photoresist film on the element isolation region becomes thinner than that on the active element region as explained above and, as a result, the size $L_2'$ of the resist pattern 111 formed on the element isolation region becomes smaller than the size $L_1$ of the resist pattern 110 on the active element region. Consequently, there arises a large deviation in the sizes, that is, $L_1'$-$L_2'$. For example, as explained above, in the case where the exposure is made using i-ray on the polycide film, if the reduced mask projection patterns 108 are set such that their sizes are of the same pattern of 0.5 μm and $L_1$ becomes 0.5 μm, the size $L_2'$ becomes 0.4 μm which is smaller by about 20%. As a result, the interconnect resistance increases, leading to a disadvantageous state in the designing of the semiconductor device. The deviation in the sizes becomes more distinct when the designing sizes are further reduced and reach a deep submicron region such as about 0.2 μm.

The second kind of the problem is as follows. Where The exposure condition is set such that, by controlling the resist pattern 111 on the element isolation region, the size $L_2'$ thereof becomes $L_0$, the size $L_1'$ of the resist pattern 110 becomes larger than $L_0'$, but this value is largely influenced by the underlying layer step, that is, the final value of $S_0$. This means that the variation in the sizes of the resist patterns 110 on the active element region becomes large. This variation results in a variation in sizes of the gate electrode 112, and causes the characteristics of transistors to be varied thereby lowering the reliability of the MOS transistors.

SUMMARY OF THE INVENTION

An object of the present invention, therefore, is to overcome the problems existing in the prior art, and to provide a high quality and a highly integrated semiconductor device with fine patterns formed under control.

According to one aspect of the invention, there is provided a semiconductor device comprising:

semiconductor patterns as elements constituting a semiconductor device on a semiconductor substrate, the semiconductor patterns being formed respectively on a first region and a second region on the semiconductor substrate, and a stepped portion formed between the first region and the second region, the stepped portion being set such that a value S of a step is S=mλ/2n wherein λ is a wavelength of photosensitive illuminating light used in a photolithography process for patterning a photoresist film, m is a positive integer, and n is a refractive index of the photoresist film.

Specifically, the first region may be a semiconductor substrate surface on which an active element is formed, and the second region may be a surface of a field oxide film formed on the semiconductor substrate surface.

In the semiconductor device according to the invention, the semiconductor element patterns are formed respectively on the first region and the second region on the semiconductor substrate. The stepped portion is formed between the first region and the second region such that it satisfies the above equation and enables the formation of semiconductor element patterns of fine sizes under control.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF THE INVENTION

Now, preferred embodiments of the invention are explained with reference to the drawings.

Sequential process steps for fabricating a semiconductor device of a first embodiment according to the invention are explained with reference to FIGS. 2A–2F which show sectional views thereof. The explanation of such steps will also serve as an explanation of the structure of the semiconductor device.

Figure 2A:
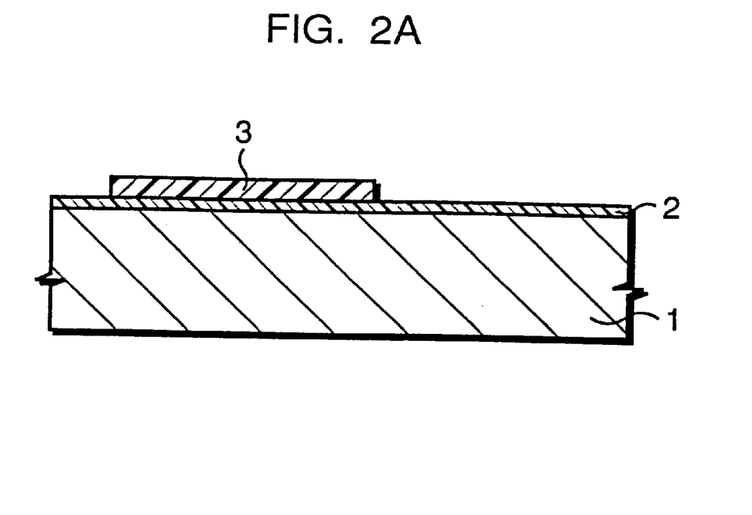
FIGS. 2A–2F are sectional views showing a structure of a first embodiment according to the invention for use in explaining sequential steps for fabricating the same.
Figure 2B:
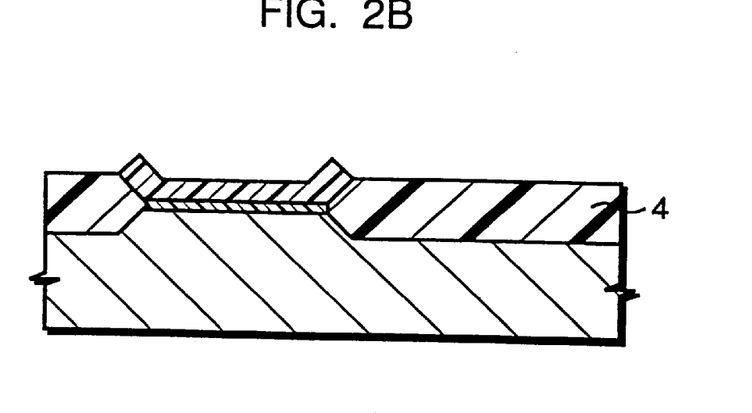

Similarly as in the prior art example, a pad oxide film 2 having a thickness of 15 nm is formed on a silicon substrate 1 by a thermal oxidation process, and a silicon nitride film is formed on the pad oxide film 2 by an LPCVD process shown in FIG. 2A. The silicon nitride film at an element isolation formation region is removed by photolithography and dry-etching processes whereby a mask nitride film 3 is formed. Thereafter, as shown in FIG. 2B, by a thermal oxidation process, the silicon substrate 1 at the element isolation formation region is selectively oxidized using the mask nitride film 3 as a mask whereby a field oxide film 4 is formed. Here, the thickness of the field oxide film 4 is set to 400 nm.

Next, a thin silicon oxide film formed on the mask nitride film 3 is etched away using a buffered hydrofluoric acid solution. Following this, the mask nitride film 3 is etched away using a high temperature phosphoric acid solution. Then, the pad oxide film 2 is etched away using a buffered hydrofluoric acid solution.

Figure 2C:
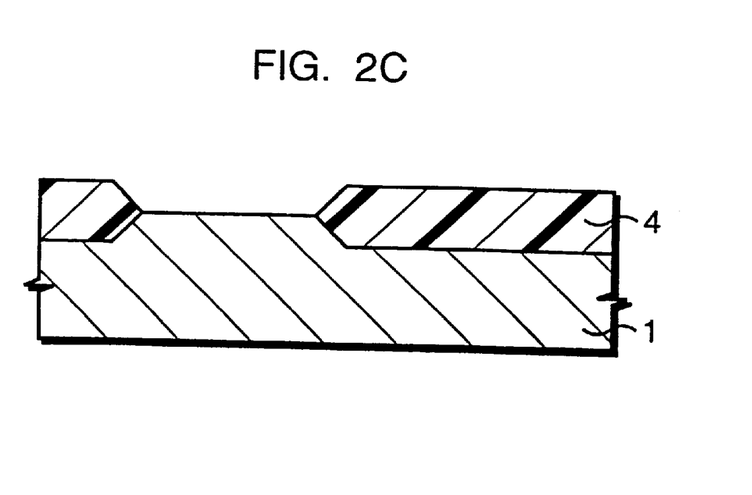

The above processes are carried out so that the degree of the etching the surface of the field oxide film 4 is constant. In this way, as shown in FIG. 2C, the silicon substrate 1 is selectively exposed, and the step between the surface of the silicon substrate and the surface of the field oxide film is set so as to be a predetermined value. This step is set so as to be on the order of 120 nm.

Figure 2D:
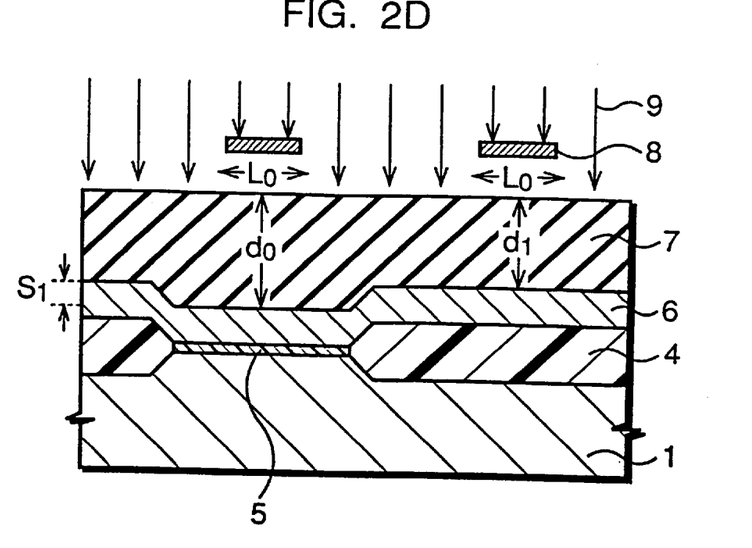

Next referring to FIG. 2D, a gate oxide film 5 having a thickness of about 10 nm is formed on the exposed surface of the silicon substrate 1 by a thermal oxidation process. Then, a polycide film 6 having a thickness of 200 nm is deposited by an LPCVD process. Here, an impurity of such as phosphorus and boron has been introduced in the polycide film 6. Thereafter, a photoresist film 7 of a positive type is applied on the entire resulting surface.

As to the photoresist film applied, as shown in FIG. 2D, if the thickness of the photoresist film 7 over the region of the field oxide film 4 is made $d_1$ and the thickness of the photoresist film 7 over the region of the gate oxide film 5 is made $d_0$, then $d_1$ is smaller than $d_0$ by the magnitude of the step $S_1$ formed by a difference between the upper surface of the field oxide film 4 and the upper surface of the gate oxide film 5.

Figure 2E:
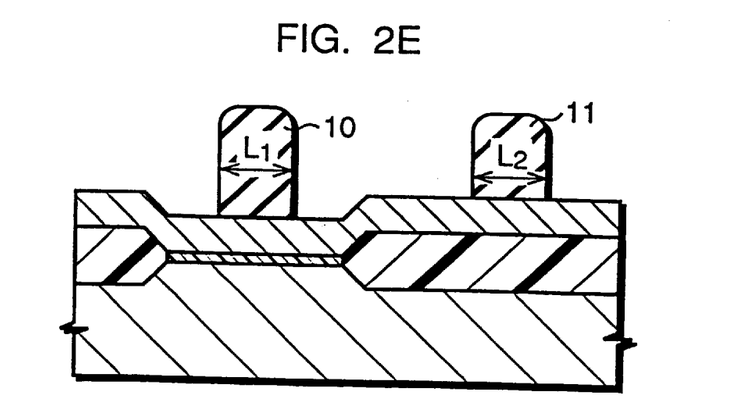

Next, the transfer of the mask projection pattern 8 onto the photoresist film 7 is carried out by the stepper. Here, the size of the mask projection pattern 8 is made $L_0$. For the photosensitive light 9 of the stepper, the i-ray having a wavelength of 365 nm is used. In this way, as shown in FIG. 2E, the resist patterns 10 and 11 are formed. Here, the size of the resist pattern 10 formed over the region of the gate oxide film 5 is made $L_1$, and that of the resist pattern 11 formed over the region of the field oxide film 4 is made $L_2$.

Figure 2F:
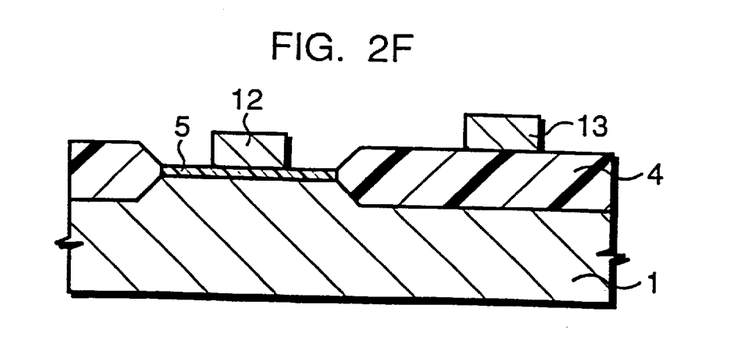

Then, the polycide film 6 mentioned above is dry-etched using the resist patterns 10 and 11 as etching masks. In this way, as shown in FIG. 2F, a gate electrode 12 is formed over the active element region, that is, the gate oxide film 5, and a gate electrode interconnect 13 is formed over the element isolation region, that is, the field oxide film 4.

By the above process, it is possible to make the gate electrode 12 over the active element region and the gate electrode interconnect 13 over the field oxide film 4 substantially the same size. The effect of the invention resulting from the above is further explained with reference to FIG. 3.

Figure 3:
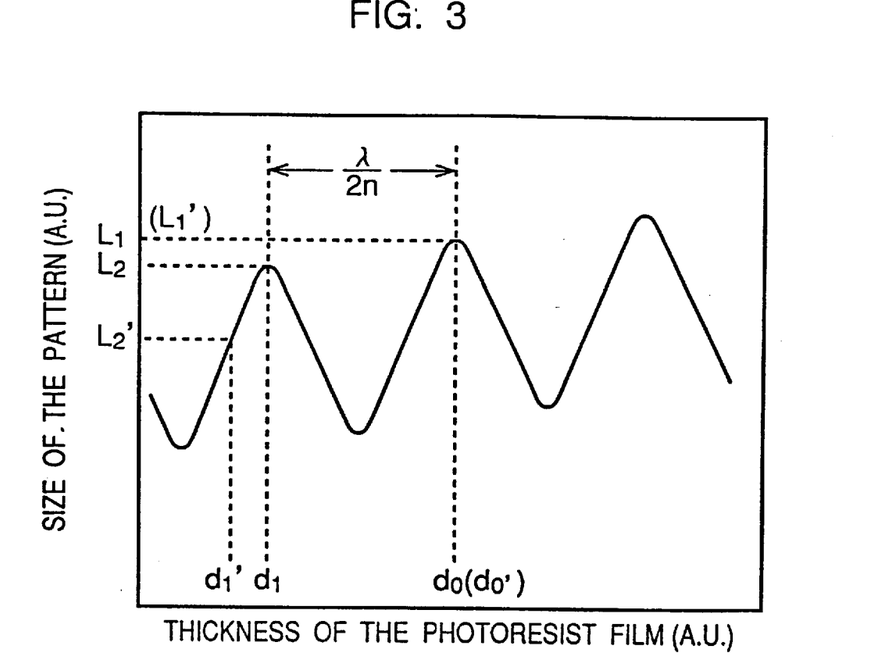
FIG. 3 is a graph showing pattern sizes for use in explaining the effect of the invention.

FIG. 3 is a graph showing a relationship between the size of the pattern formed through a photolithography process using the stepper and the thickness of the photoresist film. As shown therein, the size of the pattern projected on the photoresist film changes at a cycle of $\lambda/2n$ value with respect to the thickness of the photoresist film. Here, $\lambda$ is the wavelength of the photosensitive illuminating light, and n is an optical refractive index of the photoresist film and this value is normally on the order of 1.6. Therefore, where the underlying layer step, that is, the value of $d_0-d_1$, is set so as to be $\lambda/2n$, the sizes of the resist patterns $L_1$ and $L_2$ explained above will substantially be of the same value. It can be appreciated that substantially the same effect is achieve if the S value is an integer multiple of $\lambda/2n$. This, in the above explained embodiment, is when $S_1$ is integer times of 114 nm.

Further, as can be appreciated from FIG. 3, when the thickness of the photoresist film is about 1 µm, the variation of its thicknesses is at a maximum and, if the underlying layer step $S_1$ is less than 20% from $\lambda/2n$, the variation in sizes of the final resist pattern can be controlled to about 10%. The variation of such a magnitude is within a tolerable range in the fabrication of semiconductor devices. This means that even when the value of the underlying layer step $S_1$ explained above varies on the order of 20% from $\lambda/2n$, the application is not prevented.

In the prior art techniques, there is no control of the underlying layer step $S_1$. Thus, as FIG. 3 also shows, there arises a large deviation in photoresist film thicknesses $d_0'-d_1'$, that is, a deviation of $S_0$ value from $\lambda/2n$. In such a case, the size of $L_2'$ of the resist pattern 111 is significantly reduced as compared with $L_1'$.

Figure 4:
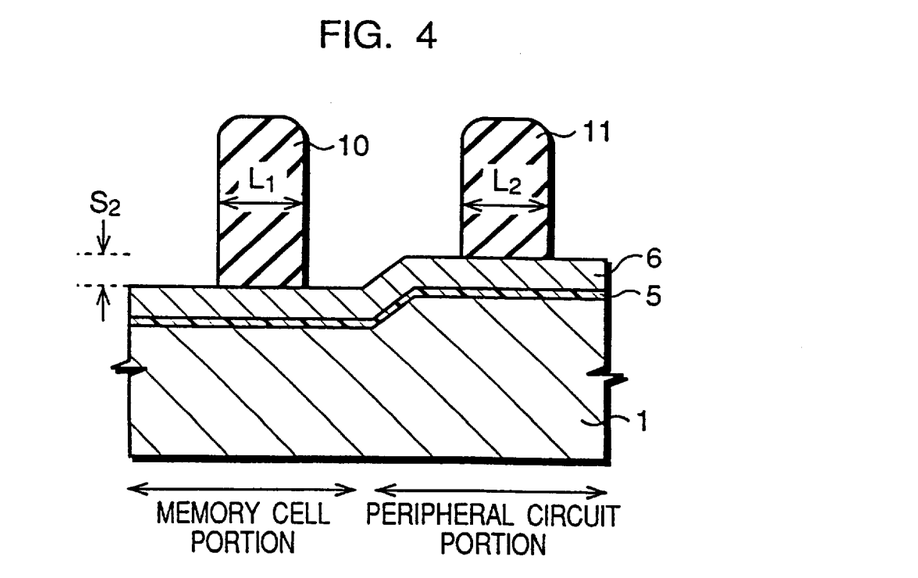
FIG. 4 is a sectional view showing a semiconductor element of a second embodiment according to the invention.

Now, a second embodiment of the invention is explained with reference to FIG. 4. The structure of this embodiment is basically the same as that of the first embodiment. However, a region at which the underlying layer step is formed in this embodiment is different from that in the first embodiment. That is, a concave (low level) and convex (high level) portion is formed on the silicon substrate and it is in this region that a gate electrode of the MOS transistor is formed. FIG. 4 shows a sectional view of such a semiconductor element. Here, the same reference numerals and symbols are used for illustrating the same elements shown and explained for the first embodiment.

As shown in FIG. 4, the concave portion is formed on a surface of the silicon substrate 1. This is formed using a dry-etching process or a selective thermal oxidation process. A memory cell portion is formed in the concave portion, and peripheral circuit portions are formed in the remaining portion. A gate oxide film 5 having a thickness of about 8 nm is formed on the concave and convex surface of the silicon substrate 1 by a thermal oxidation process. Then, a conductive polysilicon film having a thickness of 100 nm and a tungsten silicide film having a thickness of about 100 nm are deposited in a stacked form whereby a polycide film 6 is formed. Following this, resist patterns 10 and 11 are formed in the same way as in the first embodiment.

In the above process, the value of the step $S_2$ is set so as to be $S_2 \approx m\lambda/2n$ as explained above. The sizes $L_1$ and $L_2$ of the resist patterns become substantially the same for the reason already explained, and the gate electrodes formed by a dry-etching process using such patterns will become substantially the same size.

The method as according to this embodiment wherein the concave and convex portions are formed on the surface of the silicon substrate is effective and advantageous in the case where, as in a DRAM, a memory cell is formed by one MOS transistor and one capacitor, and this capacitor is of a stack type structure. If this DRAM is to be formed on the surface of the silicon substrate by an ordinary method, the memory section protrudes as the capacitor is the stack type, and there is produced a large step between the memory cell portion and the peripheral circuit formation region. This step makes the interconnect arrangement difficult. Thus, the effective way to avoid this problem is to provide in advance the concave and convex portion on the silicon substrate and to form the memory cell portion in the concave portion.

Now, a third embodiment of the invention is explained with reference to FIGS. 5A–5F, which show sectional views of a structure under fabrication for use in explaining sequential process steps of the fabrication wherein an N-well and a P-well are formed in self-alignment on a surface of the silicon substrate.

Figure 5A:
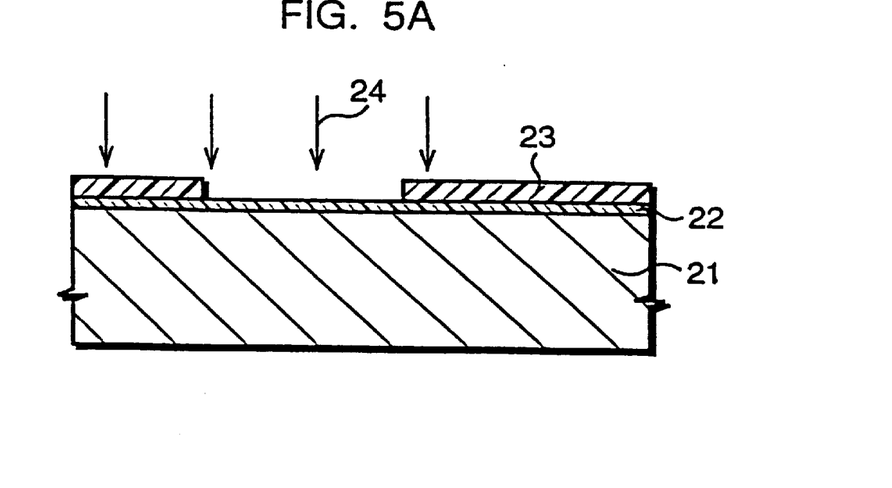
FIGS. 5A–5F are sectional views showing a structure of a third embodiment according to the invention for use in explaining sequential steps for fabricating the same.

As shown in FIG. 5A, a first pad oxide film 22 having a thickness of 50 nm is formed on the silicon substrate 21 by a thermal oxidation process and, on this film 22, a silicon nitride film having a thickness of 200 nm is formed by an LPCVD process. Then, the silicon nitride film at an element isolation formation region is removed by photoli-thography and dry-etching processes whereby a first mask nitride film 23 is formed. Following this, a phosphorus impurity is ion-implanted at an N-well formation region using the first mask nitride film 23 as a mask. Here, the ion implantation energy is 100 keV and its dose is set to $1 \times 10^{13}$ ion/cm$^2$.

Figure 5B:
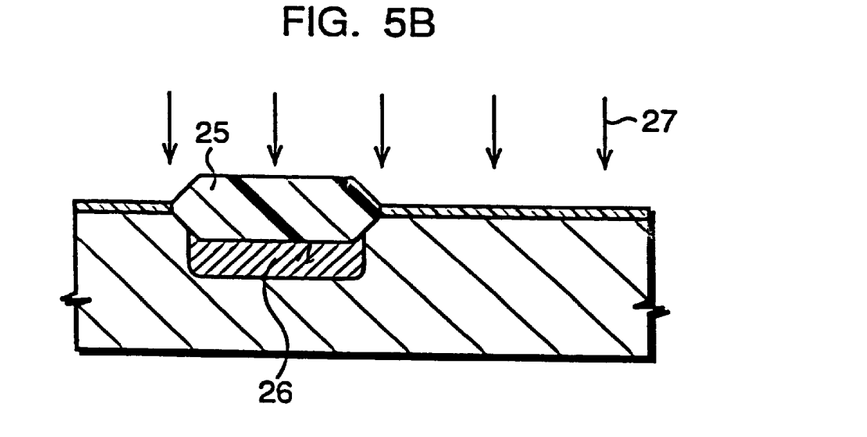

Next, a thick oxide film 25 is selectively formed by a thermal oxidation process using the first mask nitride film 23 again as an oxidation mask. Here, an oxidation temperature is 1000° C. and a thickness of the thick oxide film 25 is on the order of 250 nm. As shown in FIG. 5B, in this thermal oxidation process, the ion-implanted phosphorus impurity is simultaneously thermally diffused whereby an N-well is formed.

Figure 5C:
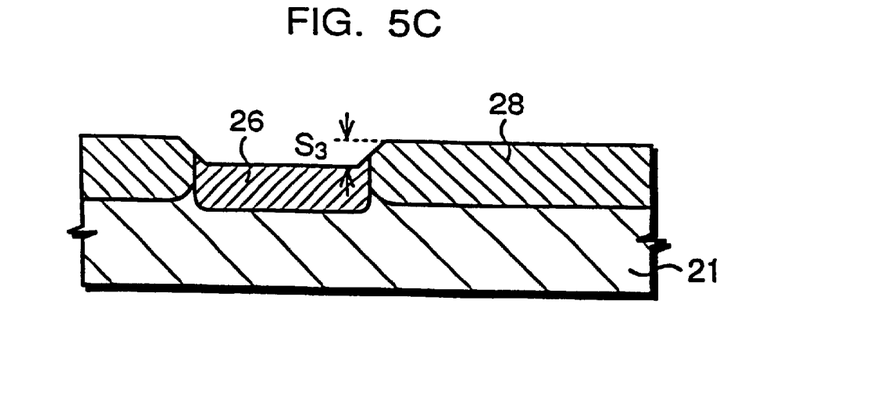

Then, a boron impurity 27 is ion-implanted on the entire surface. Here, the ion implantation energy is 30 keV and its dose is $1 \times 10^{13}$ ion/cm$^2$. Thereafter, a thermal process is carried out at a temperature of 1100° C. In this way, the final N-well 26 and P-well 28 are formed. Then, as shown in 5C, the first pad oxide film 22 and the thick oxide film 25 are etched away using a buffered hydrofluoric acid solution.

As shown in FIG. 5C, the surface region of the N-well 26 on the silicon substrate 21 is shaped in a concave form, and a step $S_3$ is formed with respect to the P-well 28. This concave region on the N-well 26 is resulted from the removal of the thin oxide film 25. The step $S_3$ is set such that it corresponds to $m\lambda/2n$ for the reason already explained with respect to the first embodiment. For example, where the photosensitive illuminating light for the exposure is i-ray, the step $S_3$ may be integer times of 114 nm. That is, the thickness of the thick oxide film 25 may be set to about 250 nm or about 500 nm.

Figure 5D:
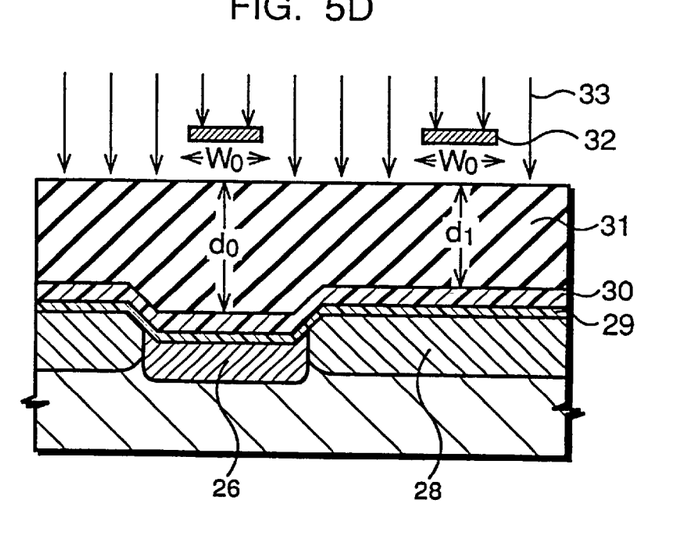

Next referring to FIG. 5D, a second pad oxide film 29 having a thickness of 15 nm is formed by a thermal oxidation process, and a silicon nitride film 30 having a thickness of 100 nm is formed by an LPCVD process. Following this, a photoresist film 31 is applied on the entire surface.

In applying the photoresist film 31, where the thickness of the photoresist film over the region of the P-well 28 is made $d_1$ and that of the photoresist film over the region of the N-well 26 is made $d_0$, the thickness $d_1$ becomes smaller than the thickness do by the value of the step as seen from FIG. 5D. Here, the underlying layer step is a step $S_3$ between the surface of the region of the P-well 28 and the surface of the region of the N-well 26.

Figure 5E:
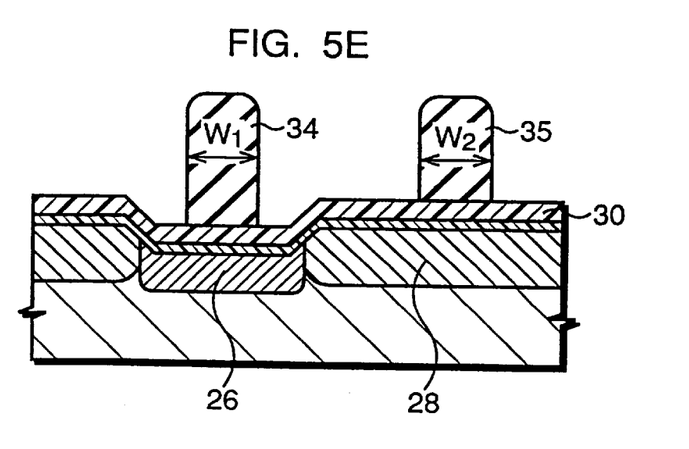

Next, the transfer of the mask projection pattern 32 onto the photoresist film 31 is carried out by the stepper. Here, the size of the mask projection pattern 32 is made $W_0$. For the photosensitive illuminating light 33 for the stepper, i-ray having a wavelength of 365 nm is used. In this way, as shown in FIG. 5E, the process results in the formation of resist patterns 34 and 35. Here, the size of the resist pattern 34 formed on the region of the N-well 26 is made $W_1$ and that of the resist pattern 35 is made $W_2$.

Figure 5F:
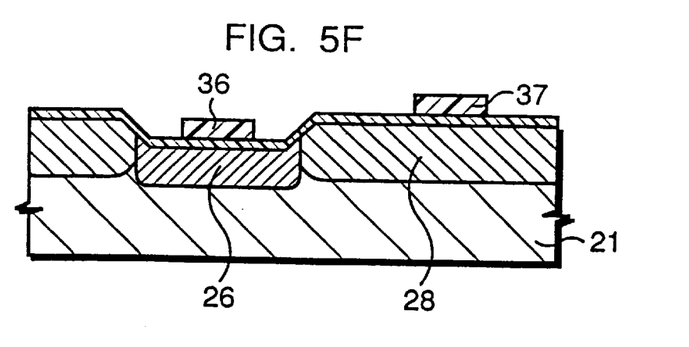

Thereafter, the silicon nitride film 30 is dry-etched using the resist patterns 34 and 35 as etching masks. As shown in FIG. 5F, the process results in the formation of a second mask nitride film 36 over the region of the N-well 26 and a second mask nitride film 37 over the P-well region 28. The sizes of these nitride films can be made substantially the same as each other. The advantageous effect obtained is as already explained with reference to FIG. 3.

In this embodiment, in the subsequent processes, the silicon substrate 21 is thermally oxidized using the second mask nitride films 36 and 37 as thermal oxidation masks whereby, as explained with regard to the first embodiment, the field oxide film is selectively formed.

Figure 6A:
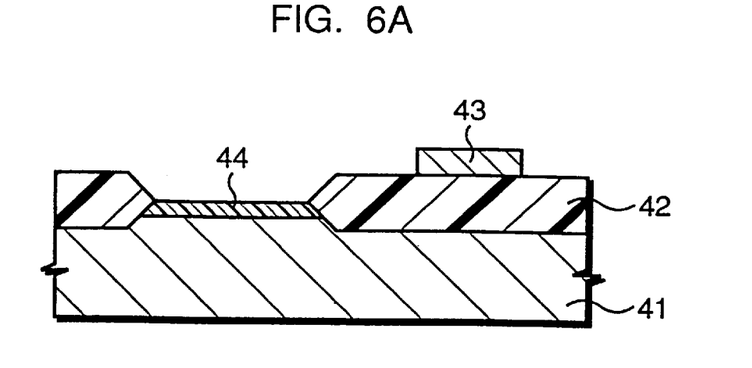
FIGS. 6A–6F are sectional views also showing a structure of a fourth embodiment according to the invention for use in explaining sequential steps for fabricating the same.

Now, a fourth embodiment of the invention is explained with reference to FIGS. 6A–6F, which show sectional views of a structure under fabrication for use in explaining sequential steps of the fabrication wherein the invention is applied to the formation of contact holes. As shown in FIG. 6A, a field oxide film 42 is formed on a surface of a P-conductivity type silicon substrate 41 by a thermal oxidation process. Here, the thickness of this field oxide film 42 is set to about 410 nm.

Next, a gate oxide film (not shown) is formed. This gate insulating film is a silicon oxide film formed by a thermal oxidation process and having a thickness of 10 nm. Then, a polycide film in which a conductive polysilicon film having a thickness of 100 nm and a tungsten silicide film having a thickness of 130 nm are stacked together is deposited. Thereafter, the polycide film thus deposited is patterned by a known processing technology whereby a gate electrode interconnect 43 is formed. After these process steps, the thermal process for ion-implantation of arsenic is carried out on the entire surface whereby an $n^+$-diffusion layer 44 is formed.

Figure 6B:
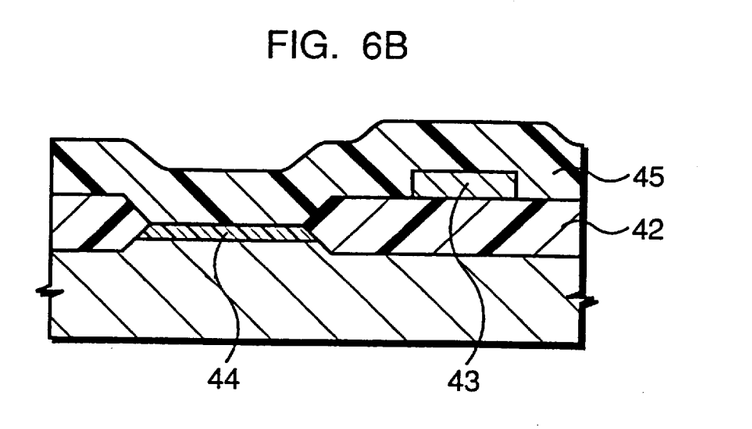
Figure 6C:
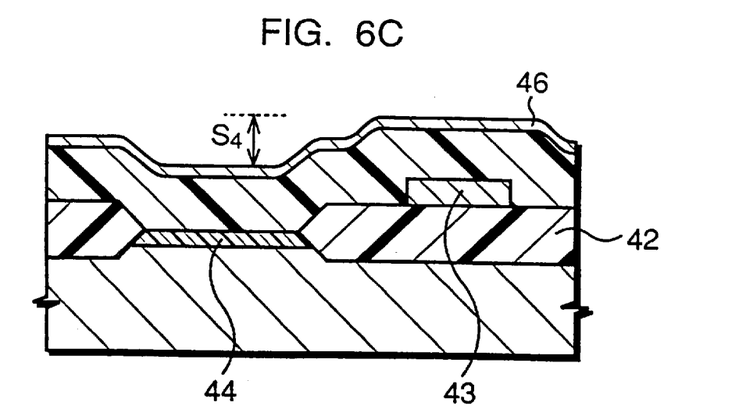

Next as shown in FIG. 6B, a silicon oxide film is deposited by a CVD process, and an interlayer insulating film 45 is formed. Then, as shown in FIG. 6C, on the interlayer insulating film 45, a film having a thickness of 100 nm–200 nm is formed, the film being a high melting point metal film such as a titanium film and a tungsten film, or a reflective metal film 46 constituted by a titanium nitride film. Here, the step $S_4$ shown in FIG. 6C is set so as to be $S_4 \approx m\lambda/2n$. This step $S_4$ is the sum of a step produced by the field oxide film 42 and a step produced by the gate electrode interconnect 43.

Figure 6D:
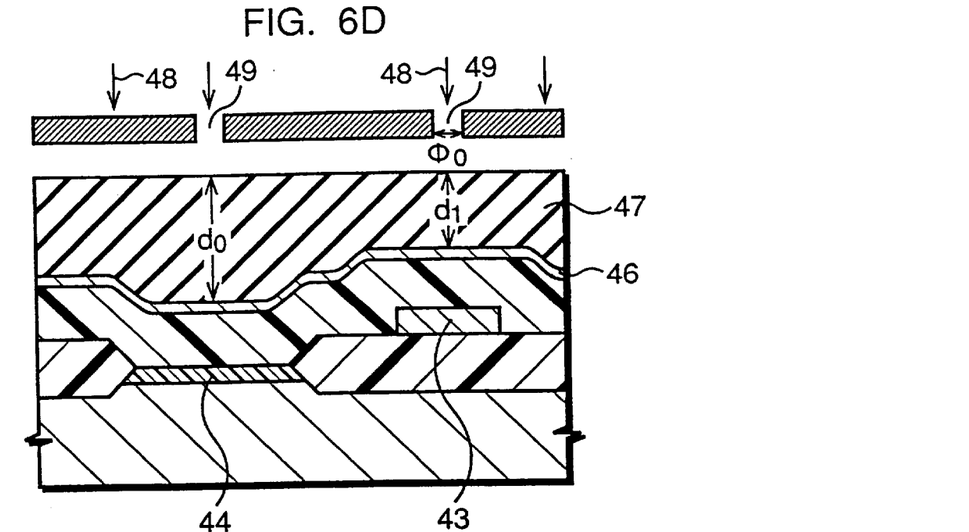

As shown in FIG. 6D, a photoresist film 47 is applied on the reflective metal film 46. Thereafter, by the stepper using i-ray, photosensitive illuminating light 48 is irradiated on the photoresist film 47 through a mask projection pattern 49. The size of the mask projection pattern 49 is made $\Phi_0$.

Figure 6E:
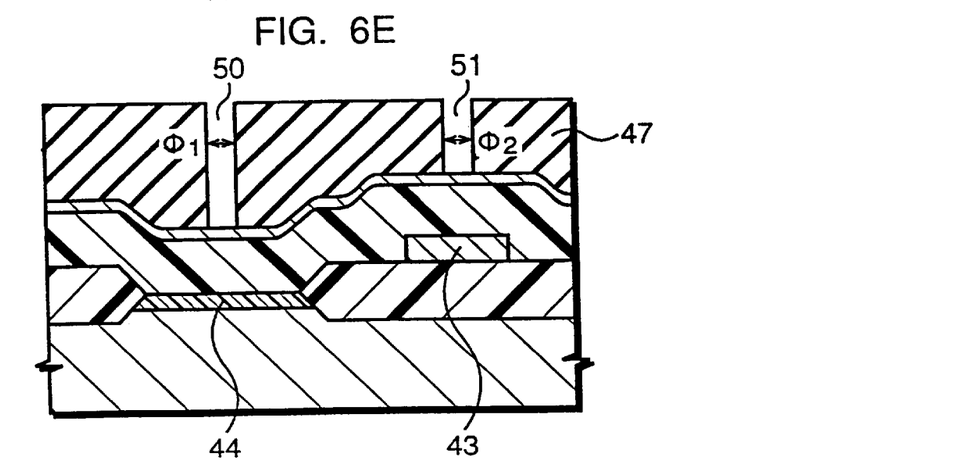

Then, as seen in FIG. 6E, the irradiated region is removed by a process using a known developing solution whereby resist patterns 50 and 51 for contact holes are formed. If the sizes of these resist patterns are represented respectively by $\Phi_1$ and $\Phi_2$, the values of $\Phi_1$ and $\Phi_2$ will become substantially the same.

Figure 6F:
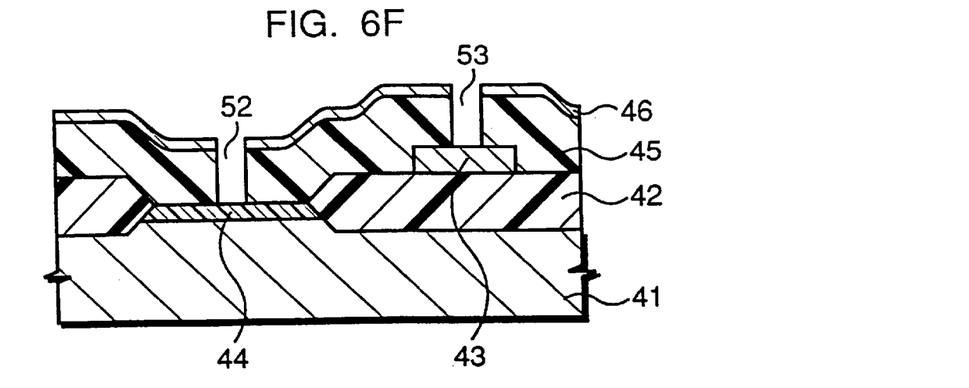

As shown in FIG. 6F, the reflective metal film 46 and the interlayer insulating film 45 are selectively dry-etched using the patterned photoresist film 47 as an etching mask. In this way, a contact hole 52 is formed on an $n^+$-diffusion layer 44 and a contact hole 53 is formed on the gate electrode interconnect 43. Here, the sizes of the contact holes are set to be substantially the same as each other.

For the above embodiments, the explanation has been made referring to the case wherein the sensitive illuminating light of the stepper is i-ray. However, the invention, of course, is not limited to the use of such light as it is possible for the photosensitive illuminating light to be g-ray (wavelength being 436 nm) or excimer laser light of KrF (wavelength being about 248 ni) and, further, excimer laser light of ArF (wavelength being about 193 nm). However, it is a requirement that the film thickness of materials be set such that the step to develop in the semiconductor element satisfies the equation $S \approx m\lambda/2n$.

The above embodiments refer to the cases wherein the value of the step satisfies the equation given above. It is to be noted, however, that the present invention is effective even when the step deviates from the above equation by about 20%.

As explained above, for forming the semiconductor element at the region having a step, this step S is set so as to substantially satisfy the equation $S = m\lambda/2n$ wherein m is a positive integer, $\lambda$ is a wavelength of the photosensitive illumination light of the stepper, and n is a refractive index of the photoresist film.

Thus, in the photolithography process for the patterning of the semiconductor element, it is possible to form the pattern of a predetermined size uniformly under control over the high level region and the low level region.

The variation in the sizes of the patterns formed in the high level region and the low level region can be reduced to lower than 1/6 as compared with the that in the prior art, which is a significant reduction.

Thus, the present invention enables the miniaturization or higher integration of the semiconductor device, and the enhancement of high quality semiconductor devices.

While the invention has been described in its preferred embodiments, it is to be understood that the words which have been used are words of description rather than limitation and that changes within the purview of the appended claims may be made without departing from the true scope of the invention as defined by the claims.

What is claimed is:

1. A method of forming a semiconductor device comprising steps of:

providing a substrate having a surface comprising a first portion having a first height and a second portion having a second height and a step having a step height equal to a difference between said first height and said second height;

photoresist having a refractive index over said surface of said substrate; and patterning said photoresist by exposing said photoresist to light having a wavelength to form patterned sections, wherein said step height is approximately equal to an integer multiple of said wavelength divided by two times said refractive index of said photoresist film.

2. The method as in claim 1, wherein said patterning step includes positioning a mask comprised of a plurality of strips over said photoresist and said mask strips have a uniform width.

3. The method as in claim 1, wherein said step of patterning said photoresist forms said patterned sections with a uniform width.

4. The method as in claim 1, wherein said step height is within 20% of said integer multiple of said wavelength divided by two times said refractive index of said photoresist film.

5. The method as in claim 4, wherein said semiconductor device comprises a metal oxide semiconductor transistor.

6. The method as in claim 1, wherein said semiconductor device comprises a dynamic random access memory.

7. The method as in claim 1, wherein said semiconductor device comprises an insulated-gate field effect transistor.

* * * * *